(12) United States Patent
Yamaguchi et al.

(10) Patent No.: US 6,702,952 B2
(45) Date of Patent: Mar. 9, 2004

(54) PIEZOELECTRIC/ELECTROSTRICTIVE MATERIAL AND METHOD FOR PREPARING THE SAME

(75) Inventors: Hirofumi Yamaguchi, Nagoya (JP); Takaaki Koizumi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/151,462

(22) Filed: May 20, 2002

(65) Prior Publication Data

US 2003/0114295 A1 Jun. 19, 2003

(30) Foreign Application Priority Data

Dec. 19, 2001 (JP) ......................... 2001-385733

(51) Int. Cl.$^7$ ......................... C04B 35/49; H01L 41/187
(52) U.S. Cl. ................. 252/62.9 R; 501/137; 501/138
(58) Field of Search .................. 252/62.01 R; 501/138, 501/137

(56) References Cited

U.S. PATENT DOCUMENTS 5,084,424 A * 1/1992 Abe et al. ................... 501/137

* cited by examiner

Primary Examiner—C. Melissa Koslow
(74) Attorney, Agent, or Firm—Burr & Brown

(57) ABSTRACT

A piezoelectric/electrostrictive material is made of a $BaTiO_3$-based porcelain composed mainly of $BaTiO_3$ and containing $CuO$ and $Nb_2O_5$. 85% or more of the crystal grains constituting the porcelain are grains having particle diameters of 10 $\mu$m or less and the maximum particle diameters of the grains are in a range of 5 to 25 $\mu$m. This $BaTiO_3$-based piezoelectric/electrostrictive material is superior in piezoelectric/electrostrictive properties to conventional products and can be suitably used in an actuator or a sensor.

5 Claims, No Drawings

PIEZOELECTRIC/ELECTROSTRICTIVE MATERIAL AND METHOD FOR PREPARING THE SAME

BACKGROUND OF THE INVENTION AND RELATED ART STATEMENT

The present invention relates to a piezoelectric/electrostrictive material made of a porcelain obtained by firing, for example, to a piezoelectric/electrostrictive material used as an actuator or a sensor both assembled as an electromechanical transducer for positioning in precision machine tool or length control of optical path in optical instrument or in valve for flow rate control, etc. More particularly, the present invention relates to a piezoelectric/electrostrictive material suitably used in a very small sensor or a highly integrated very small actuator both used in an element for measurement of liquid property or very small weight.

As piezoelectric/electrostrictive materials, there have been known $Pb(Zr,Ti)O_3$ (hereinafter referred to as PZT), $BaTiO_3$, etc. They are in use in actuators, filters, various sensors, etc. PZT type piezoelectric/electrostrictive materials have been used mainly because they are superior in overall piezoelectric properties.

Pb contained in PZT, etc. is stabilized and essentially generates no problem caused by decomposition or the like. However, there are cases that a Pb-free material is required depending upon its application. Further, since Pb-containing porcelains such as PZT, PLZT [$(Pb,La)(Zr,Ti)O_3$] and the like give rise to vaporization of small amount of Pb in high-temperature firing, they have had, particularly when used in applications requiring a thin or thick film, a problem that they hardly show stable properties owing to the compositional change during firing.

Meanwhile, $BaTiO_3$ contains no Pb and offers a promising material for such a need. $BaTiO_3$ viewed as a piezoelectric/electrostrictive material, however, is inferior in piezoelectric/electrostrictive properties to a PZT type material, and has seldom been used as an actuator or as a sensor.

SUMMARY OF THE INVENTION

The present invention has been made in view of the above-mentioned problems of the prior art and aims at providing a $BaTiO_3$-based piezoelectric/electrostrictive material which is superior in piezoelectric/electrostrictive properties to conventional products and which can be suitably used in an actuator or a sensor, and a process for producing such a piezoelectric/electrostrictive material.

A piezoelectric/electrostrictive material, when used in an actuator, is required to show a large displacement to a voltage applied. A study by the present inventor, made on the piezoelectric/electrostrictive properties of $BaTiO_3$-based porcelain indicated that by controlling the fine structure of $BaTiO_3$-based porcelain, particularly the distribution of the crystal grain constituting the $BaTiO_3$-based porcelain, a piezoelectric/electrostrictive material showing a large displacement can be obtained. This finding has led to the completion of the present invention.

According to the present invention, there is provided a piezoelectric/electrostrictive material made of a $BaTiO_3$-based porcelain composed mainly of $BaTiO_3$ and containing CuO and $Nb_2O_5$, characterized in that 85% or more of the crystal grains constituting the porcelain are grains having particle diameters of 10 μm or less and the maximum particle diameter of the grains is in a range of 5 to 25 μm.

In the piezoelectric/electrostrictive material of the present invention, at least Dart of the Ba may be substituted with Sr. Also in the present invention, the Ba/Ti ratio or the (Ba+Sr)/Ti ratio is preferably in a range of 1.001 to 1.01 because such a ratio can easily prevent the growth of abnormal grains occurring during the firing for porcelain formation and can easily control the particle diameters of the crystal grains constituting the porcelain.

According to the present invention, there is also provided a process for producing a piezoelectric/electrostrictive material made of a $BaTiO_3$-based porcelain composed mainly of $BaTiO_3$ and containing CuO and $Nb_2O_5$, characterized by weighing individual raw materials so as to give a predetermined composition, mixing and grinding them, calcinating the resulting mixed powder in the air at 850 to 950° C., then grinding the resulting calcinated material until the ground material comes to have a specific surface area of 7 $m^2$/g or less, and molding and firing the ground material.

DESCRIPTION OF PREFERRED EMBODIMENTS

The piezoelectric/electrostrictive material according to the present invention is described in more detail below. The piezoelectric/electrostrictive material according to the present invention is made of a $BaTiO_3$-based porcelain composed mainly of $BaTiO_3$ and containing CuO, $Nb_2O_5$, etc.

A specific composition of the porcelain of the present invention may be such wherein $BaTiO_3$ is the main component and part of the Ba, for example, 0.1 to 10 mole % may be substituted with Sr. Also, the porcelain of the present invention may inevitably contain Zr, Si, Al, etc. in an amount of 0.5% by weight or less based on the total weight. Further in the $BaTiO_3$-based porcelain of the present invention, the A/B ratio, which is a (Ba+Sr)/Ti, is preferably larger than 1, more preferably in a range of 1.001 to 10.1. Also, to the present porcelain are preferably added $Nb_2O$, and CuO each in an amount of 0.05 to 0.5% by weight, more preferably each in an amount of 0.1 to 0.3% by weight based on the porcelain components excluding these components. Further, to the porcelain of the present invention may be added rare earth metals and/or transition metals other than the above components, in a total amount of 0.5% by weight or less in terms of their metal oxides. Incidentally, the forms of the components added are ordinarily oxides, carbonates or sulfates thereof.

The individual crystal grains constituting the porcelain of the present invention have crystal lattices of perovskite structure. The porcelain of the present invention is characterized in that the particle diameter distribution of the crystal grains constituting the porcelain is controlled as predetermined; specifically, 85% or more of the crystal grains are constituted by grains having particle diameters of 10 μm or less and the maximum particle diameter of the grains is in a range of 5 to 25 μm. In a preferred particle diameter distribution of the crystal grains, 90% to less than 100% of the crystal grains have particle diameters of 10 μm or less and the maximum particle diameter of the grains is in a range of 10 to 25 μm.

The action mechanism for why a porcelain having the above particle diameter distribution shows superior piezoelectric/electrostrictive properties, is not clear. However, from the results shown in Examples described later, it is clear that a porcelain constituted by crystal grains having a particle diameter distribution in the above mentioned range is superior in piezoelectric/electrostrictive properties to a porcelain having a particle diameter distribution in other range.

Next, description is made on the process for producing a piezoelectric/electrostrictive material according to the present invention.

First, raw materials (oxides, hydroxides and carbonates of metal elements) are weighed as so as to give a compositional range of the present invention and are mixed using a mixer such as ball mill or the like. In this mixing, it is preferred to allow the primary particles of each raw material after mixing to have particle diameters of 1 μm or less, in order to allow the porcelain obtained to have a particle diameter distribution specified in the present invention.

Then, the resulting mixed powder is calcinated in the air at 850 to 950° C. to obtain a calcinated material. An appropriate calcination temperature is 850 to 950° C. With a calcination temperature above 950° C., the resulting sintered material is nonuniform and, with a calcination temperature below 850° C., an unreacted phase remains in the resulting sintered material, making it impossible to obtain a dense porcelain.

Next, the calcinated material obtained is ground using a grinder such as ball mill or the like until the ground material comes to have a specific surface area of preferably 7 m²/g or less, more preferably 5 m²/g or less. The ground material is molded by a monoaxial press and then by a hydrostatic press to obtain a molded material of desired shape. The molded material is fired at 1,100 to 1,250° C. to obtain a sintered material. The most appropriate firing temperature is 1,150 to 1,200° C.

In the above-mentioned production process, it is important to control the Ba/Ti ratio of $BaTiO_3$ [the (Ba+Sr)/Ti ratio when part of the Ba has been substituted with Sr] depending upon the kinds and amounts of the components (e.g. CuO and $Nb_2O_5$) added to the main component $BaTiO_3$. The Ba/Ti ratio [or the (Ba+Sr)/Ti ratio] is appropriately controlled so that an intended crystal grain diameter distribution can be obtained depending upon the amounts and forms (e.g. salt or metal) of the components added, the firing temperature, etc.

The sintered material (porcelain) obtained by firing is subjected to a polarization treatment and then allowed to stand for 24 hours or more, whereby the resulting material has a high strain property. The piezoelectric/electrostrictive material according to the present invention is superior in displacement property; therefore, it is useful as a general electromechanical transducer and is suitably used in an actuator, a sensor, etc.

EXAMPLES

The present invention is described specifically below by way of Examples. $BaCO_3$, $TiO_2$, $Nb_2O_5$, $SrCO_3$ and CuO all as starting materials were weighed so that the composition of the porcelain to be obtained became such in which 1 mole % of Ba was substituted with Sr, the A/B molar ratio [(Ba+Sr)/Ti] became 1.005, and the contents of $Nb_2O_5$ and CuO became 0.1% by weight and 0.2% by weight, respectively, based on the weight of the components other than these two components. These raw materials were subjected to wet mixing of 64 hours using water and zirconia balls of 2 mm in diameter as media, by the use of a ball mill, to allow the raw materials to have primary particle diameters of 1 μm or less.

The resulting mixture was dried and then subjected to a calcination treatment in the air at 900° C. for 2 hours. The resulting calcinated material was subjected to a grinding treatment in a ball mill. In the grinding treatment, the amount of zirconia balls, the grinding time, etc. were appropriately controlled to obtain a powder after grinding treatment (the powder is hereinafter referred to as ground powder) having an intended specific surface area. The specific surface area of the ground powder was measured by a BET method. Then, a polyvinyl alcohol as a binder was added to the ground powder. The mixture was molded into a shape of 20 mm in diameter and 15 mm in height using a monoaxial press molding machine and a hydrostatic press molding machine.

Next, the molded material obtained above was fired in the air at a firing temperature of 1,100 to 1,250° C. for a firing time of 3 hours to obtain a porcelain. A scanning electron micrograph was taken for the porcelain; from the micrograph were calculated diameters of equivalent area circles to use them as the diameters of the individual grains constituting the porcelain; from these diameters, the proportions of the individual particles were determined based on their area.

The porcelain was processed to obtain a rectangular sample of 12 mm in length, 3 mm in width and 1 mm in thickness for use as an electrode. The electrode was subjected to a polarization treatment in the thickness direction under the conditions of 70° C., 2,000 V and 15 minutes. After the polarization treatment, the electrode was allowed to stand for 100 hours and measured for strain ($S_{4000}$) of thickness direction when a voltage of 4,000 V was applied in the thickness direction, using a strain gauge. Simultaneously, piezoelectric constant $d_{31}$ of thickness direction was measured by a resonance-antiresonance method, using an impedance analyzer. The results are shown in Table 1. Incidentally, * mark in Table 1 indicates Comparative Examples.

TABLE 1

| Sample No. | Specific surface area of ground powder (m²/g) | Firing temp. (° C.) | Proportion of grains of 10 μm or less (%) | Maximum particle diameter (μm) | $S_{4000}$ (×10⁻⁶) | $d_{31}$ (pm/V) |
|---|---|---|---|---|---|---|
| 1 | 10 | 1100 | 85 | 22 | 710 | 40 |
| 2* | 10 | 1150 | 72 | 39 | 600 | 68 |
| 3* | 10 | 1200 | 56 | 48 | 600 | 80 |
| 4* | 10 | 1250 | 43 | 100 | 540 | 85 |
| 5* | 7 | 1100 | 100 | 4 | 580 | 47 |
| 6 | 7 | 1150 | 100 | 9 | 870 | 28 |
| 7 | 7 | 1200 | 99 | 14 | 980 | 31 |
| 8* | 7 | 1250 | 84 | 26 | 620 | 89 |
| 9* | 5 | 1100 | 100 | 4 | 560 | 53 |
| 10 | 5 | 1150 | 100 | 6 | 790 | 38 |

TABLE 1-continued

| Sample No. | Specific surface area of ground powder (m²/g) | Firing temp. (° C.) | Proportion of grains of 10 μm or less (%) | Maximum particle diameter (μm) | $S_{4000}$ (×10⁻⁶) | $d_{31}$ (pm/V) |
| --- | --- | --- | --- | --- | --- | --- |
| 11 | 5 | 1200 | 92 | 21 | 1040 | 13 |
| 12 | 5 | 1250 | 86 | 22 | 830 | 43 |
| 13* | 3 | 1100 | 100 | 3 | 430 | 21 |
| 14 | 3 | 1150 | 95 | 12 | 980 | 43 |
| 15 | 3 | 1200 | 90 | 16 | 1010 | 32 |
| 16 | 3 | 1250 | 85 | 19 | 810 | 53 |

As is clear from the results shown in Table 1, a piezoelectric/electrostrictive material having a high strain can be obtained by controlling the material so that 85% or more of the crystal grains constituting the material are grains having particle diameters of 10 μm or less and the maximum particle diameter of the grains is in a range of 5 to 25 μm. Such a piezoelectric/electrostrictive material of high strain is suitably used in a film type actuator or a laminated type actuator.

As described above, the present invention can provide a $BaTiO_3$-based piezoelectric/electrostrictive material which is superior in piezoelectric/electrostrictive properties to conventional products and which can be suitably used in an actuator or a sensor.

What is claimed is:

1. A piezoelectric/electrostrictive material comprising a $BaTiO_3$-based porcelain composed mainly of $BaTiO_3$ and containing CuO and $Nb_2O_5$, wherein 85% or more of the crystal grains constituting the porcelain are grains having particle diameters of 10 μm or less and the maximum particle diameters of the grains is in a range of 5 to 25 μm.

2. A piezoelectric/electrostrictive material according to claim 1, wherein at least part of the Ba is substituted with Sr.

3. A piezoelectric/electrostrictive material according to claim 1, wherein the Ba/Ti ratio is 1.001 to 1.01.

4. A piezoelectric/electrostrictive material according to claim 2, wherein the (Ba+Sr)/Ti ratio is 1.001 to 1.01.

5. A process for producing a piezoelectric/electrostrictive material made of a $BaTiO_3$-based porcelain composed mainly of $BaTiO_3$ and containing CuO and $Nb_2O_5$, comprising the steps of weighing individual raw materials so as to give a predetermined composition, mixing and grinding the raw materials, calcinating the resulting mixed powder in the air at 850 to 950° C., then grinding the resulting calcinated material until the ground material has a specific surface area of 7 m²/g or less, and molding and firing the ground material.

* * * * *

UNITED STATES PATENT AND TRADEMARK OFFICE
CERTIFICATE OF CORRECTION

PATENT NO.     : 6,702,952 B2
DATED          : March 9, 2004
INVENTOR(S)    : Hirofumi Yamaguchi and Takaaki Koizumi It is certified that error appears in the above-identified patent and that said Letters Patent is hereby corrected as shown below:

Column 1,
Line 11, please add -- obtain -- after "to"
Line 13, please add -- a -- after "in"
Line 14, please add -- an -- after "of"
Line 15, please change "instrument" to -- instruments --
Line 15, please add -- a -- after "in"
Line 19, please add -- a -- after "of"
Line 19, please add -- a -- after "or"
Line 27, please delete ", etc."
Line 38, please add -- , which is -- after "BaTiO3"
Line 54, please add -- in response -- after "displacement"
Line 55, please delete ", -- after "inventor"

Column 2,
Lines 22-23, please change "Description of Preferred Embodiments" to -- Detailed Description of the Invention --
Line 55, please change "; specifically," to -- . Specifically, --

Column 3,
Line 4, please change "range" to -- ranges --
Line 11, 25, please add -- a -- after "as"
Line 48, please change "property" to -- properties --

Column 4,
Line 21, please add -- the -- after "after"
Lines 44 and 47, please add -- the -- after "of"

Signed and Sealed this

First Day of June, 2004

JON W. DUDAS
*Acting Director of the United States Patent and Trademark Office*